(12) United States Patent
Umemoto

(10) Patent No.: US 9,031,467 B2
(45) Date of Patent: May 12, 2015

(54) DISCHARGE DEVICE

(71) Applicant: Konica Minolta, Inc., Tokyo (JP)

(72) Inventor: Hiroaki Umemoto, Neyagawa (JP)

(73) Assignee: Konica Minolta, Inc., Tokyo (JP)

( * ) Notice: Subject to any disclaimer, the term of this patent is extended or adjusted under 35 U.S.C. 154(b) by 74 days.

(21) Appl. No.: 13/779,302

(22) Filed: Feb. 27, 2013

(65) Prior Publication Data

US 2013/0223884 A1 Aug. 29, 2013

(30) Foreign Application Priority Data

Feb. 29, 2012 (JP) .................................. 2012-43337

(51) Int. Cl.
*G03G 15/02* (2006.01)
*H01J 37/30* (2006.01)
*G03G 15/01* (2006.01)

(52) U.S. Cl.
CPC ............ *G03G 15/0291* (2013.01); *H01J 37/30* (2013.01); *G03G 15/0189* (2013.01); *G03G 2215/0132* (2013.01)

(58) Field of Classification Search
USPC ......................................................... 399/170
See application file for complete search history.

(56) References Cited

U.S. PATENT DOCUMENTS

| | | | | |
|---|---|---|---|---|
| 4,425,035 A | * | 1/1984 | Tarumi et al. | 347/123 |
| 4,963,738 A | * | 10/1990 | Gundlach et al. | 250/326 |
| 6,493,529 B1 | * | 12/2002 | Umemura et al. | 399/168 |
| 6,952,548 B2 | * | 10/2005 | Uchida et al. | 399/173 |
| 2008/0025767 A1 | | 1/2008 | Takagami | |
| 2009/0110447 A1 | | 4/2009 | Sato et al. | |

FOREIGN PATENT DOCUMENTS

| | | | |
|---|---|---|---|
| JP | 06016128 A | * | 1/1994 |
| JP | 6-161281 | | 6/1994 |
| JP | 8-31545 | | 2/1996 |
| JP | 9-114194 | | 5/1997 |
| JP | 2004-109549 | | 4/2004 |

(Continued)

OTHER PUBLICATIONS

Notification of Reasons for Refusal mailed Dec. 24, 2013, directed to JP Application No. 2012-043337; 8 pages.

(Continued)

*Primary Examiner* — Clayton E LaBalle
*Assistant Examiner* — Leon W Rhodes, Jr.
(74) *Attorney, Agent, or Firm* — Lucas & Mercanti, LLP

(57) ABSTRACT

A discharge device for generating a corona discharge aimed at an object facing the discharge device, the discharge device comprising: a plate-like main discharge electrode configured to receive an applied direct current voltage and generate the corona discharge aimed at the object; a plate-like auxiliary discharge electrode disposed in parallel with the main discharge electrode and configured to receive an applied direct current voltage which is opposite in polarity to the applied direct current voltage received by the main discharge electrode, thereby causing the corona discharge to occur between the main discharge electrode and the auxiliary discharge electrode; and a plate-like insulating member disposed between the main discharge electrode and the auxiliary discharge electrode, wherein the insulating member is disposed in such a manner that a discharge current from the main discharge electrode flows to both the object and the auxiliary discharge electrode.

19 Claims, 10 Drawing Sheets

(56) References Cited

FOREIGN PATENT DOCUMENTS

| JP | 2008-32820 | 2/2008 |
| JP | 2008-287069 | 11/2008 |
| JP | 2009-103973 | 5/2009 |
| JP | 2010-276803 | 12/2010 |

OTHER PUBLICATIONS

Japanese Office Action, Notification of Reasons for Refusal, Patent Application No. 2012-043337. Mailing Date: Jun. 3, 2014 (3 pages).
English translation of Japanese Office Action, Notification of Reasons for Refusal, Patent Application No. 2012-043337. Mailing Date: Jun. 3, 2014 (5 pages).

* cited by examiner

FIG. 6

| Minus electrode (mm) | Plus electrode (mm) | Distance between electrodes (mm) | Potential difference (kV) |
|---|---|---|---|
| 0 | 2 | 2 | 2 |
| 0 | 4 | 4 | 4 |
| 0 | 6 | 6 | 6 |
| 0 | 8 | 8 | 8 |
| 2 | 2 | 4 | 4 |
| 2 | 4 | 6 | 6 |
| 2 | 6 | 8 | 8 |
| 2 | 8 | 10 | 10 |
| 4 | 2 | 6 | 6 |
| 4 | 4 | 8 | 8 |
| 4 | 6 | 10 | 10 |
| 4 | 8 | 12 | 12 |

DISCHARGE DEVICE

CROSS-REFERENCE TO RELATED APPLICATIONS

This application is based on application No. 2012-43337 filed in Japan, the contents of which are hereby incorporated by reference.

BACKGROUND OF THE INVENTION (1) Field of the Invention

The present invention relates to a discharge device, and in particular to a technology for improving a non-uniform discharge occurring in the discharge device for generating a corona discharge, and miniaturizing the discharge device.

(2) Description of the Related Art

Image forming apparatuses of an intermediate transfer method form a color image by overlaying toner images of, for example, colors Y (yellow), M (magenta), C (cyan) and K (black) on an intermediate transfer belt. The toner image carried by the intermediate transfer belt is transferred electrostatically onto a recording sheet by a second transfer roller, and then thermally fixed onto the recording sheet by a fixing device.

To transport the recording sheet carrying the toner image to the fixing device, the recording sheet needs to be separated from the intermediate transfer belt. However, when the recording sheet is stuck to the intermediate transfer belt by the electrostatic adsorption force or the like, the recording sheet might not be separated.

In view of the above problem, a separation claw, for example, may be used to separate the recording sheet from the intermediate transfer belt. However, since the separation claw contacts a surface of the recording sheet on which an image has been formed, the separation claw may scrape off unfixed toner, thereby causing an image noise to occur.

As another attempt, the curvature of the second transfer roller, on which the intermediate transfer belt is suspended, may be increased so that the recording sheet can be separated from the intermediate transfer belt by the rigidity (elastic restoring force) of the recording sheet itself. However, there is a limit to increasing the curvature of the second transfer roller.

In view of these circumstances, a method has been proposed. According to this method, the electrostatic adsorption force, which causes the recording sheet to be stuck to the intermediate transfer belt, is weakened by neutralizing the recording sheet by using the corona discharge (for example, see Japanese Patent Application Publication No. 09-114194).

However, the method of neutralizing the recording sheet does not necessarily separate the recording sheet from the intermediate transfer belt with absolute certainty. In particular, when the recording sheet is a sheet of thin paper, separating the recording sheet becomes further difficult since a sheet of thin paper is more deformable than a sheet of regular paper. This difficulty in separating the recording sheet is considered to be attributable to non-uniform neutralization of the recording sheet which is attributable to non-uniform discharge of the corona discharge.

With regard to the problem, one might consider as the countermeasure, for example, use of the scorotron structure or application of an alternating current (AC) voltage. However, with the scorotron structure, increase in the device size and cost cannot be avoided. Also, the application of an AC voltage brings a new problem that an AC noise may occur.

Furthermore, since there is no room around the second transfer roller, the corona discharge device needs to be miniaturized. The miniaturization of the corona discharge device is also a demand by a charging device which charges the photosensitive drum by the corona discharge.

SUMMARY OF THE INVENTION

It is therefore an object of the present invention to provide a discharge device that does not increase the cost, is small-scale, and reduces the non-uniform discharge.

The above object is fulfilled by a discharge device for generating a corona discharge aimed at an object facing the discharge device, the discharge device comprising: a plate-like main discharge electrode configured to receive an applied direct current voltage and generate the corona discharge aimed at the object; a plate-like auxiliary discharge electrode disposed in parallel with the main discharge electrode and configured to receive an applied direct current voltage which is opposite in polarity to the applied direct current voltage received by the main discharge electrode, thereby causing the corona discharge to occur between the main discharge electrode and the auxiliary discharge electrode; and a plate-like insulating member disposed between the main discharge electrode and the auxiliary discharge electrode, wherein the insulating member is disposed in such a manner that a discharge current from the main discharge electrode flows to both the object and the auxiliary discharge electrode.

BRIEF DESCRIPTION OF THE DRAWINGS

These and the other objects, advantages and features of the invention will become apparent from the following description thereof taken in conjunction with the accompanying drawings which illustrate a specific embodiment of the invention. In the drawings.

Figure 7A:
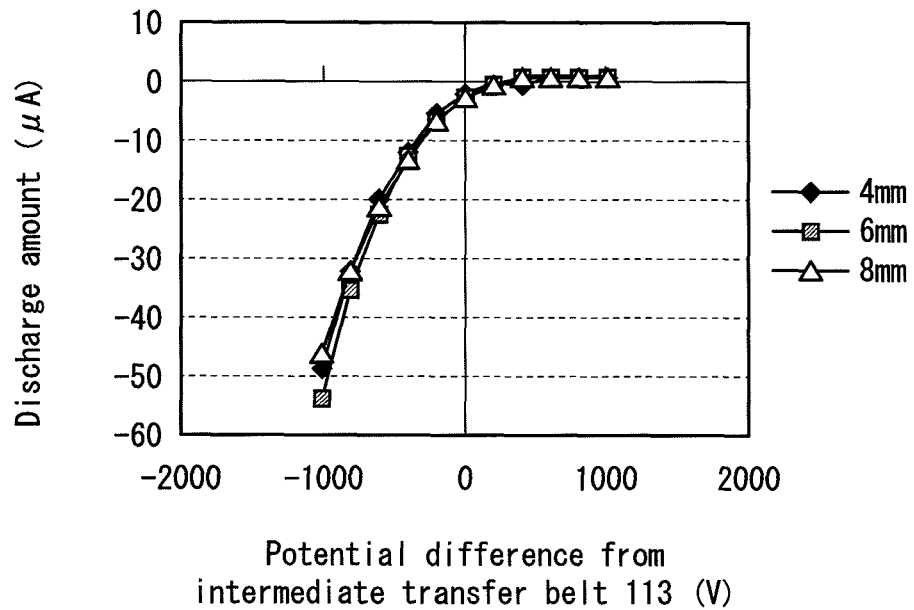
Figure 7B:
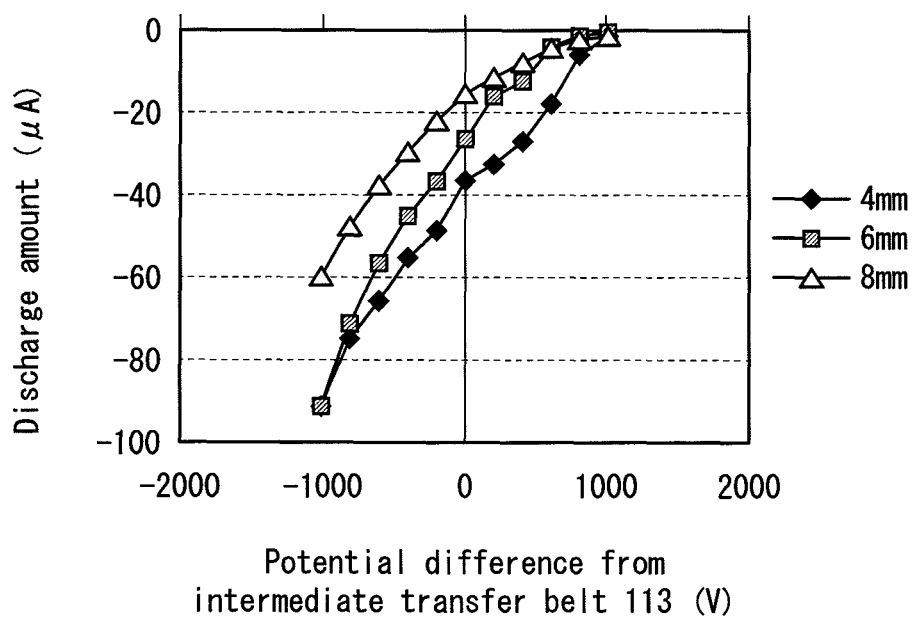
Figure 8A:
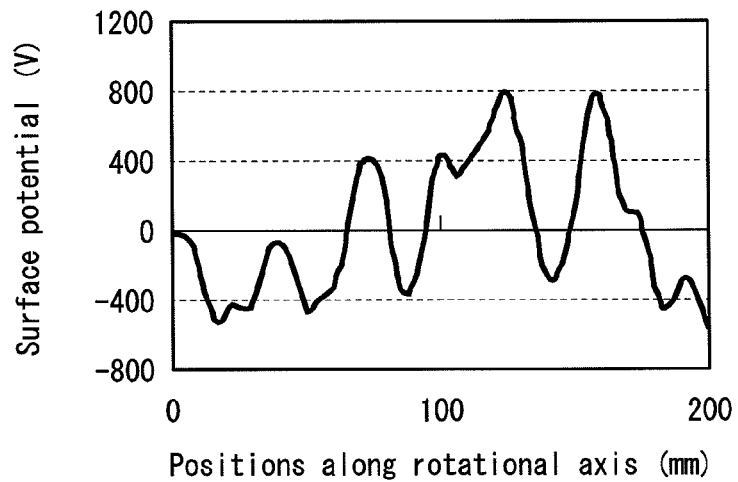
Figure 8B:
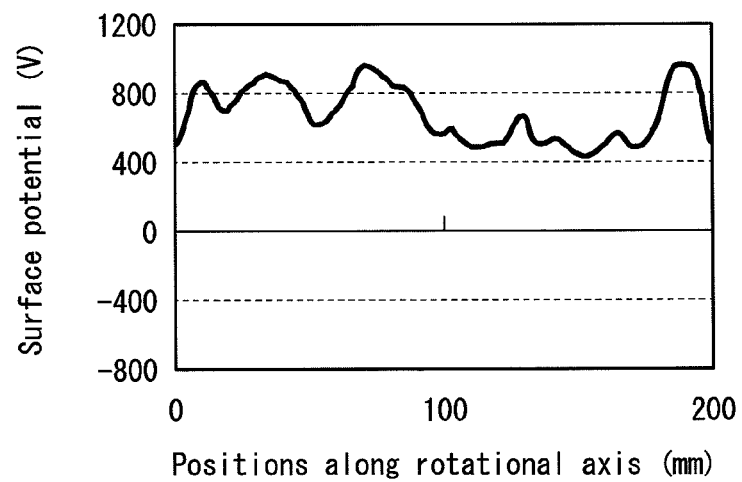
Figure 8C:
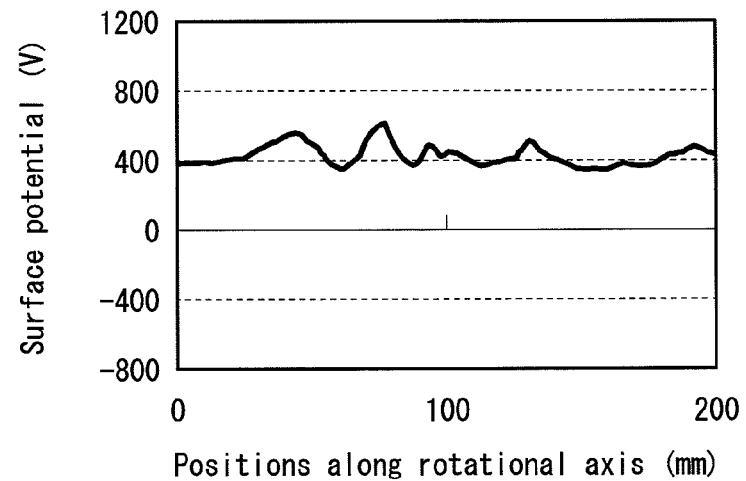
Figure 9:
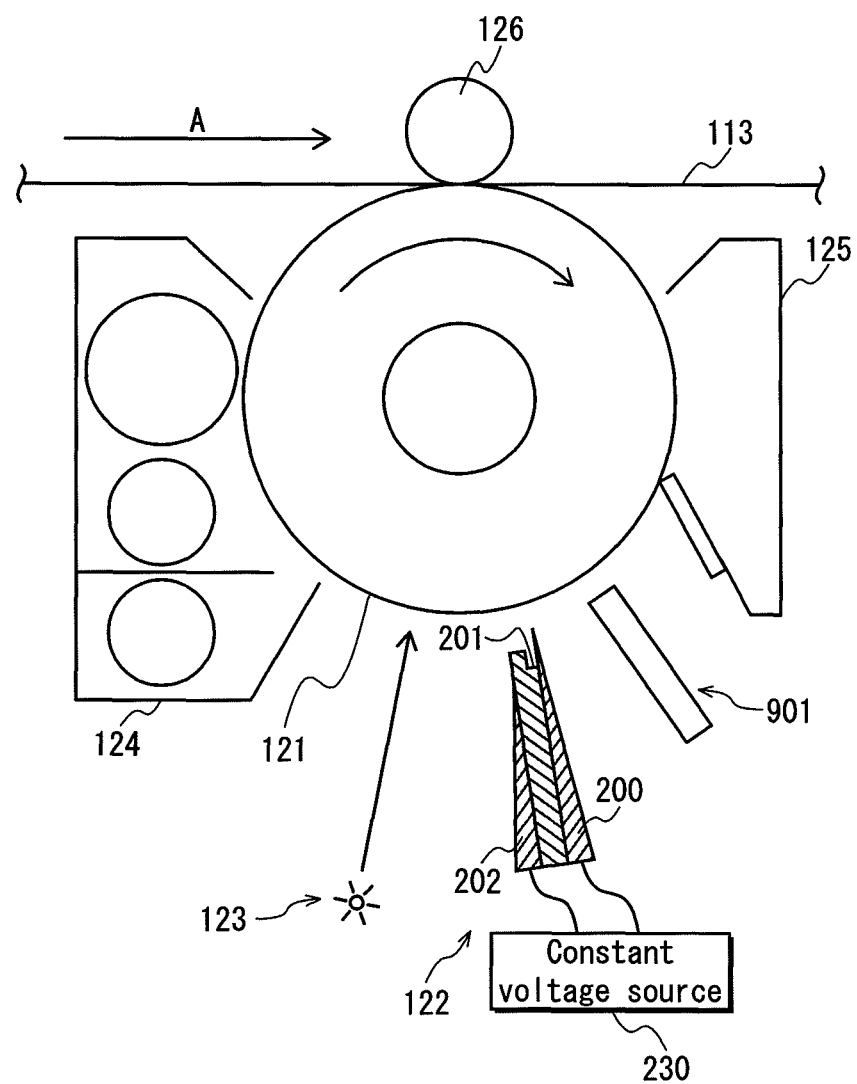
Figure 10:
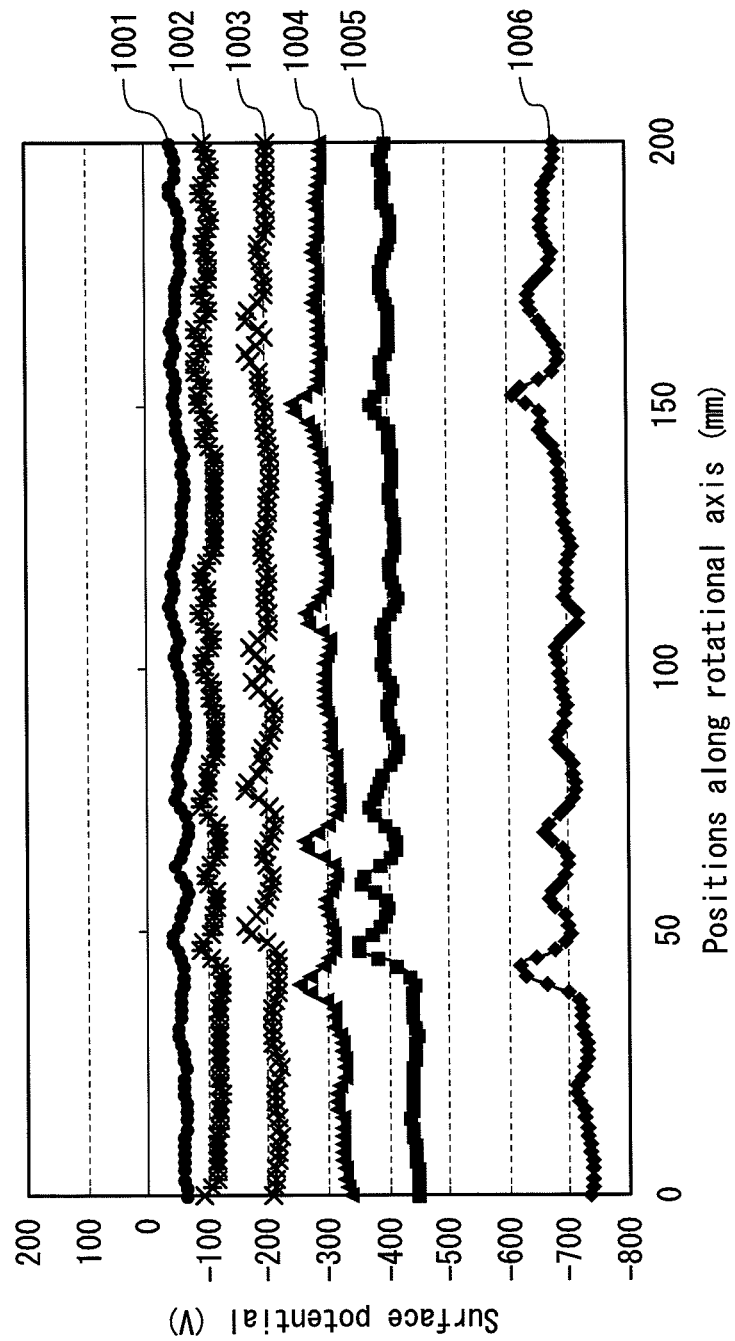

FIG. 6 is a table illustrating the relationship among the distance from the discharge electrodes to the tip of the discharge prevention plate, the creeping distance between the two discharge electrodes, and the lowest potential difference at which a spark discharge occurs;

FIG. 7A is a graph illustrating the relationship between the distance between the discharge electrodes 200 and 202 and the amount of discharge current, and indicates the total amount of discharge current flowing from the discharge electrodes 200 and 202 to the intermediate transfer belt 113;

FIG. 7B is a graph illustrating the relationship between the distance between the discharge electrodes 200 and 202 and the amount of discharge current, and indicates the amount of discharge current flowing from the minus discharge electrode 200 to the intermediate transfer belt 113;

FIG. 8A is a graph illustrating the non-uniform neutralization observed when only a direct current (DC) voltage of −240 V was applied to the discharge electrode by the conventional technology that uses only one discharge electrode;

FIG. 8B is a graph illustrating the non-uniform neutralization observed when, in addition to the DC voltage of −2400 V, an AC voltage with frequency of 1 kHz and amplitude of 6 kV was applied;

FIG. 8C is a graph illustrating the non-uniform neutralization observed when, in addition to the DC voltage of −2400 V, an AC voltage with frequency of 1 kHz and amplitude of 10 kV was applied;

FIG. 9 is a cross-sectional view schematically illustrating the structure of an image creating unit 111 in a modification of the present invention; and FIG. 10 is a graph illustrating the charging performance of the charging device 122 in a modification of the present invention.

DESCRIPTION OF EMBODIMENTS

The following describes an embodiment of the discharge device of the present invention with reference to the attached drawings.

[1] Structure of Image Forming Apparatus

First, the structure of the image forming apparatus of the present embodiment is described.

Figure 1:
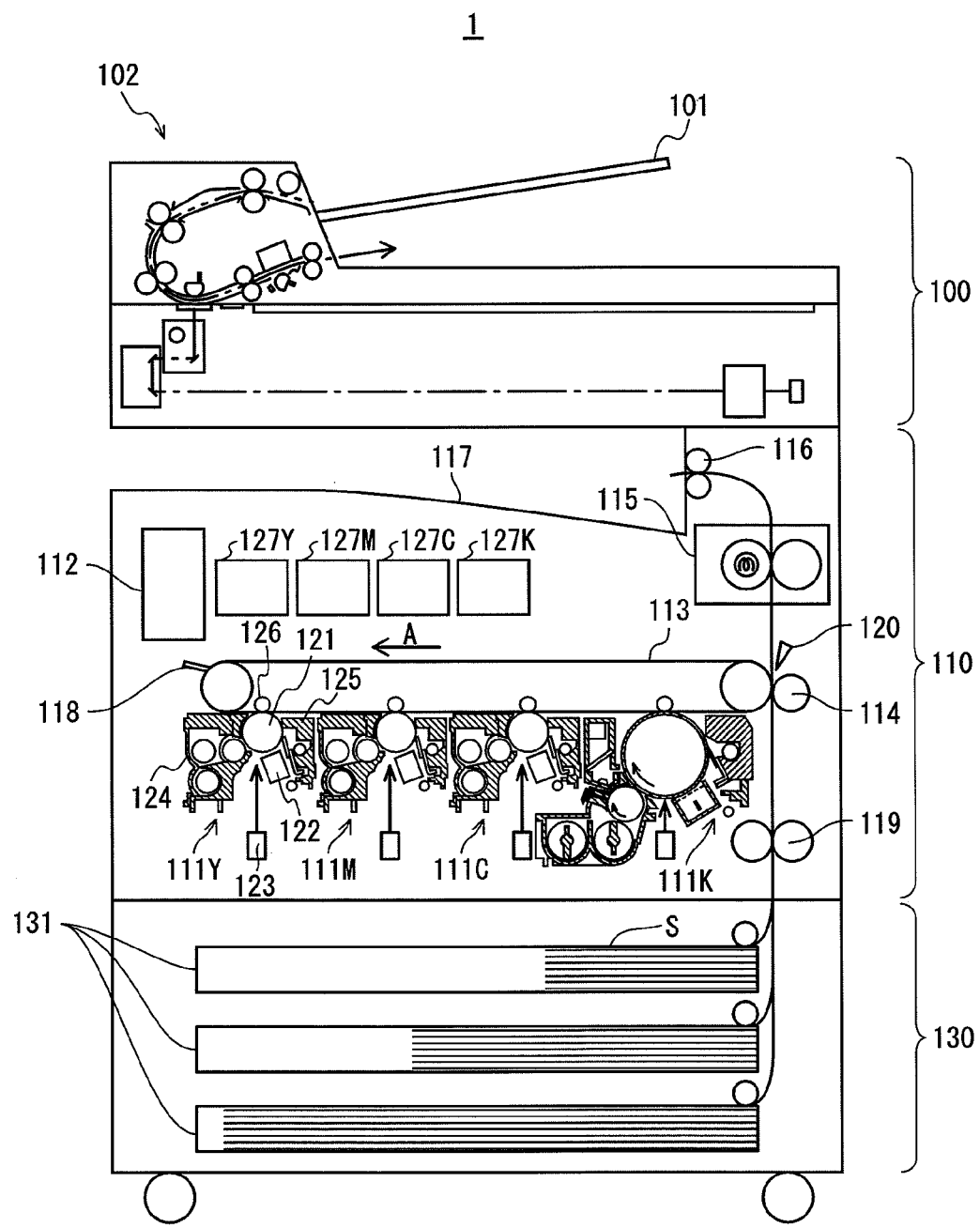
FIG. 1 illustrates a main structure of an image forming apparatus in an embodiment of the present invention.

FIG. 1 illustrates a main structure of the image forming apparatus in the present embodiment. As illustrated in FIG. 1, an image forming apparatus 1 is a so-called tandem color MFP (Multi-Function Peripheral) and includes a document reader 100, an image forming unit 110, and a sheet feeder 130. The document reader 100 causes an ADF (Automatic Document Feeder) 102 to feed a document placed on a document tray 101, reads the document optically and generates image data. The generated image data is stored in a controller 112 which is described below.

The image forming unit 110 includes image creating units 111Y-111K, a controller 112, an intermediate transfer belt 113, a pair of second transfer rollers 114, a fixing device 115, a pair of paper-ejection rollers 116, a paper tray 117, a cleaning blade 118, a pair of timing rollers 119, and a discharge device 120. Also, the image forming unit 110 is attached with toner cartridges 127Y-127K for supplying toner of colors Y (yellow), M (magenta), C (cyan) and K (black).

The image creating units 111Y-111K receive supply of toner from the toner cartridges 127Y-127K, respectively, and form toner images of colors Y, M, C and K under the control of the controller 112. The image creating unit 111Y includes, for example, a photosensitive drum 121, a charging device 122, an exposing device 123, a developing device 124, and a cleaning device 125. Under the control of the controller 112, the charging device 122 charges the outer circumferential surface of the photosensitive drum 121 uniformly. The exposing device 123 performs an image exposure on the outer circumferential surface of the photosensitive drum 121 in accordance with the image data, thereby forming an electrostatic latent image.

The developing device 124 supplies toner to the outer circumferential surface of the photosensitive drum 121 so that the electrostatic latent image is developed (an image appears). A transfer voltage is applied in advance to a first transfer roller 126, and the toner image on the outer circumferential surface of the photosensitive drum 121 is electrostatically transferred (first transferred) onto the intermediate transfer belt 113 by the electrostatic adsorption. Subsequently, the cleaning device 125 scrapes off the remaining toner with a cleaning blade, and neutralizes the outer circumferential surface of the transistor forming layer 121 with a neutralizing lamp.

Similarly, the image creating units 111M-111K create toner images of colors M, C and K, respectively. The created toner images are first transferred onto the intermediate transfer belt 113 so as to be overlaid with each other. The intermediate transfer belt 113 is an endless rotor, and caused to move rotationally in the direction indicated by the arrow A to transport the first transferred toner image to the pair of second transfer rollers 114.

The sheet feeder 130 includes a sheet feed cassette 131 storing variable sizes of recording sheets S separately, and supplies the recording sheets S to the image forming unit 110. The recording sheets S are fed one by one in parallel with the transportation of the toner image by the intermediate transfer belt 113, and are transported to the pair of second transfer rollers 114 via the pair of timing rollers 119. The pair of timing rollers 119 is configured to adjust the timing at which each recording sheet S arrives at the pair of second transfer rollers 114.

The pair of second transfer rollers 114 is composed of a pair of rollers between which a potential difference is created when they receive application of a second transfer voltage. The rollers in the pair press each other to form a transfer nip. In the transfer nip, the toner image is transferred electrostatically (second transferred) from the intermediate transfer belt 113 to a recording sheet S. The recording sheet S with the toner image transferred thereon is sent to the discharge device 120, where the recording sheet S is neutralized, and then is transported to the fixing device 115. Note that, after the second transfer, the toner remaining on the intermediate transfer belt 113 is further transported in the direction indicated by the arrow A, then scraped off by the cleaning blade 118 and discarded.

The fixing device 115 heats, while applying pressure to, the toner image such that melted toner image is fixed onto the recording sheet S. The recording sheet S with the thermally fixed toner image is ejected onto the paper tray 117 by the pair of paper-ejection rollers 116. The controller 112 controls the operation of the image forming apparatus 1 including the above components and an operation panel (not illustrated). Also, the controller 112 transmits and receives image data to/from, and receives jobs from, other devices including a personal computer (PC). The controller 112 further transmits and receives facsimile data via a facsimile line.

Note that the toner remaining on the intermediate transfer belt 113 may be removed by a cleaning brush, a cleaning roller or the like, instead of the cleaning blade.

[2] Configuration and Structure of Discharge Device 120

The following describes the configuration and structure of the discharge device 120.

Figure 2:
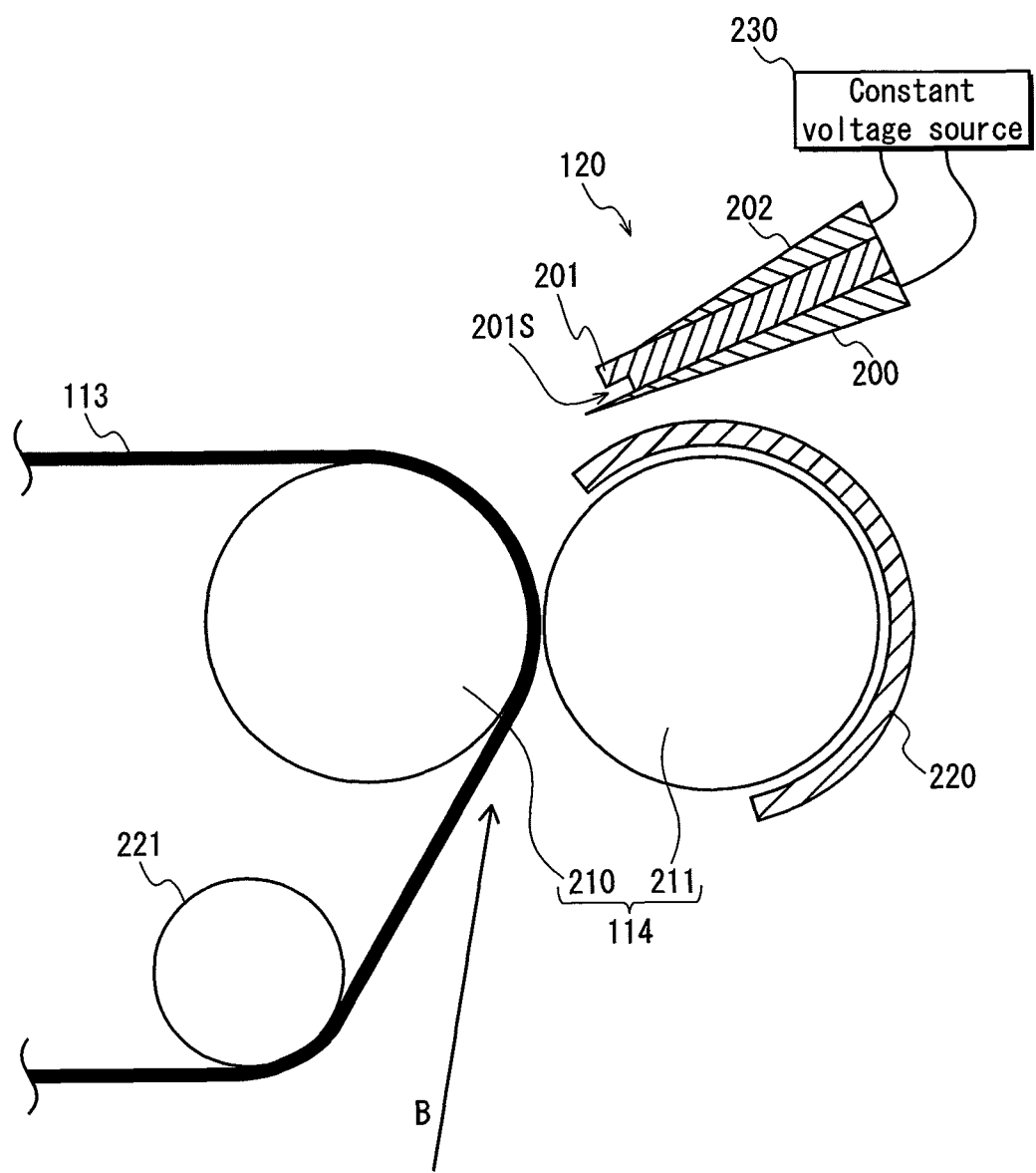
FIG. 2 illustrates the configuration and structure of the discharge device 120.

FIG. 2 illustrates the configuration and structure of the discharge device 120. As illustrated in FIG. 2, the discharge device 120 includes a discharge prevention plate 201 and discharge electrodes 200 and 202, where the discharge electrodes 200 and 202 are stuck to different main surfaces of the discharge prevention plate 201. An end of each of the discharge electrodes 200 and 202 closer to the intermediate transfer belt 113 is a tapered discharge end. The discharge electrode 200 is disposed on the upstream side of the discharge electrode 202 in the recording sheet transportation direction. The discharge end of the discharge electrode 200, which is hereinafter referred to as "minus discharge electrode 200", protrudes toward the intermediate transfer belt 113 in the same degree as an end of the discharge prevention plate 201 on the intermediate transfer belt 113 side. A minus DC voltage (in the present embodiment, −2000 V) is applied to the minus discharge electrode 200 by a constant voltage source 230.

On the other hand, the discharge end of the discharge electrode 202, which is hereinafter referred to as "plus discharge electrode 202", recedes from the intermediate transfer belt 113 than the discharge prevention plate 201. A plus DC voltage (in the present embodiment, 4000 V) is applied to the plus discharge electrode 202 by the constant voltage source 230. That is to say, the plus discharge electrode 202 is farther away from the intermediate transfer belt 113 than the minus discharge electrode 200. Also, a step 201S is formed in the end of the discharge prevention plate 201 closer to the intermediate transfer belt 113 in the surface portion facing the minus discharge electrode 200.

The distance between the minus discharge electrode 200 and the intermediate transfer belt 113, and the distance between the discharge prevention plate 201 and the intermediate transfer belt 113 are each 4 mm. Also the distance between the plus discharge electrode 202 and the intermediate transfer belt 113 is 12 mm. With this structure, the recording sheet is prevented from contacting the discharge device 120.

Figure 3:
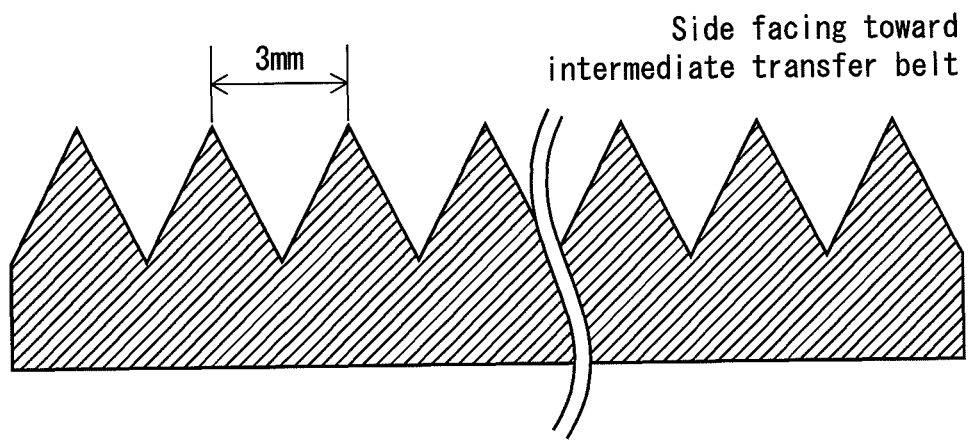
FIG. 3 is a plan view illustrating the shape of the minus discharge electrode 200.

FIG. 3 is a plan view illustrating the shape of the minus discharge electrode 200. In the minus discharge electrode 200, saw teeth are formed only on a side that faces toward the intermediate transfer belt 113, and the pitch of the saw teeth is approximately 3 mm. The plus discharge electrode 202 has a similar shape.

Back to FIG. 2, the pair of second transfer rollers 114 is composed of an intermediate transfer roller 210 and a transfer roller 211 which are each 30 mm in outer diameter. The intermediate transfer belt 113 is wound around the intermediate transfer roller 210. The transfer roller 211 is separated from the discharge device 120 by an insulating resin housing 220. Note that the intermediate transfer belt 113 is wound around a roller 221 as well.

In the present embodiment, a minus-charged toner is used. By applying a plus voltage to the transfer roller 211, a toner image is second transferred onto the recording sheet. As a result, the recording sheet on which the toner image has been second transferred is charged with plus electricity. The minus discharge electrode 200 neutralizes the recording sheet by discharging minus electricity on the recording sheet.

[3] Evaluation Experiment

An experiment was conducted to evaluate the neutralization performance of the discharge device 120 of the present invention. The following explains the results of the experiment.

(1) Reduction of Non-Uniform Potential Due to Application of Opposite-Polarity Voltage First, the non-uniform neutralization of the recording sheet was evaluated by applying different voltages to the plus discharge electrode 202. Note that an insulating film having been charged to 1000 V was used as the recording sheet, and a voltage of −2000 V was applied to the minus discharge electrode 200. Also, a surface potential detector was used to measure the non-uniform neutralization of the recording sheet.

Figure 4A:
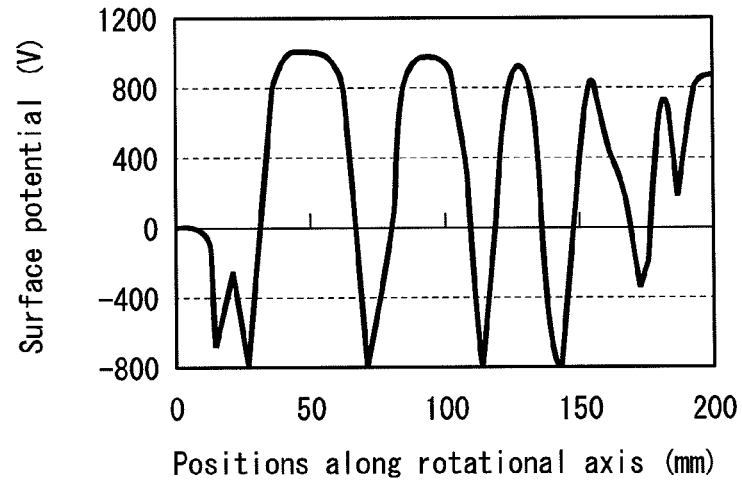
FIG. 4A is a graph illustrating an example of non-uniform neutralization of the recording sheet in the case where a voltage of 0 V was applied to the plus discharge electrode 202.
Figure 4B:
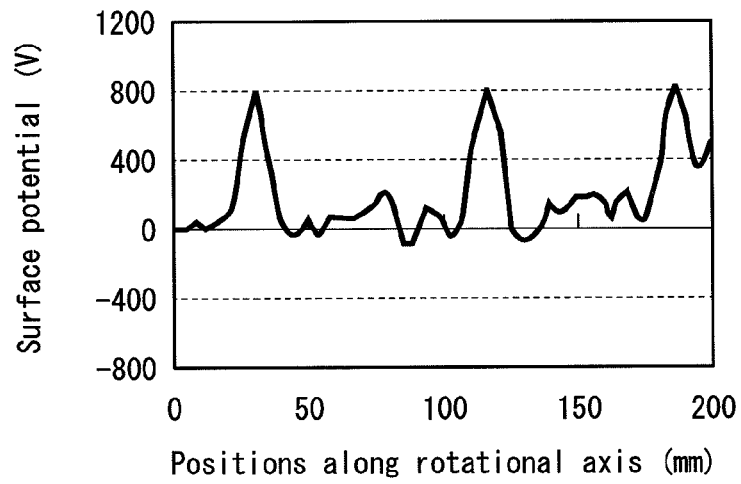
FIG. 4B is a graph illustrating an example of non-uniform neutralization of the recording sheet in the case where a voltage of 3000 V was applied to the plus discharge electrode 202.
Figure 4C:
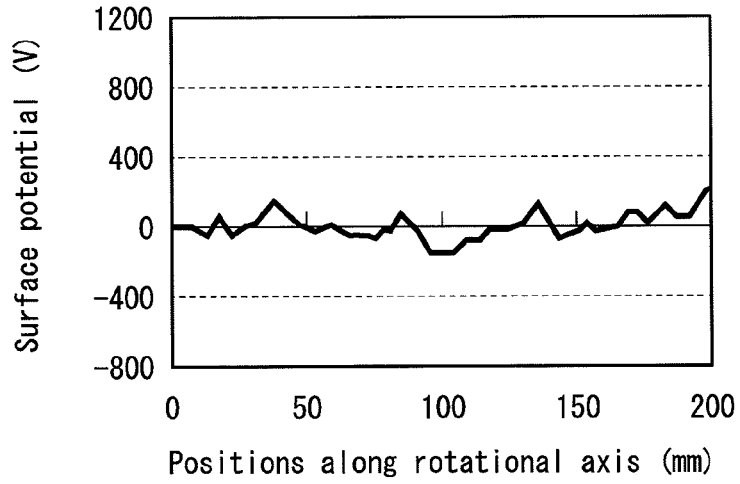
FIG. 4C is a graph illustrating an example of non-uniform neutralization of the recording sheet in the case where a voltage of 4000 V was applied to the plus discharge electrode 202.

FIGS. 4A-4C are graphs illustrating examples of non-uniform neutralization of the recording sheet in the cases where voltages of 0 V, 3000 V and 4000 V were applied to the plus discharge electrode 202, respectively. The vertical axis in the graphs represents the surface potential measured by the surface potential detector, and the horizontal axis represents the position of the intermediate transfer roller 210 in the rotational axis direction.

As illustrated in FIGS. 4A-4C, the higher the voltage applied to the plus discharge electrode 202 is, the smaller the non-uniform neutralization of the recording sheet is. When a voltage of 0 V is applied to the plus discharge electrode 202 (FIG. 4A), namely, when the plus discharge electrode 202 is grounded, it is expected that a non-uniform neutralization occurs approximately in the same degree as a neutralization device of a conventional technology that uses only one discharge electrode (corresponding to the minus discharge electrode 200). In the other cases (FIGS. 4B and 4C), non-uniform neutralizations in smaller degrees than the case of FIG. 4A occurred. This indicates that the discharge device 120 of the present invention provides higher performance in terms of neutralization than the conventional technology.

(2) Relationship Between Discharge Current Amount and Non-Uniform Neutralization Next, the relationship between the discharge current amount and the non-uniform neutralization was evaluated by measuring the amount of discharge current flowing from the discharge electrodes 200 and 202 and the total amount of discharge current, for each case of different values of the potential difference between the discharge electrode 200, 202 and the intermediate transfer belt 113. Note that the total amount of discharge current is an amount of current that flows between the discharge device 120 and the intermediate transfer belt 113.

Figure 5A:
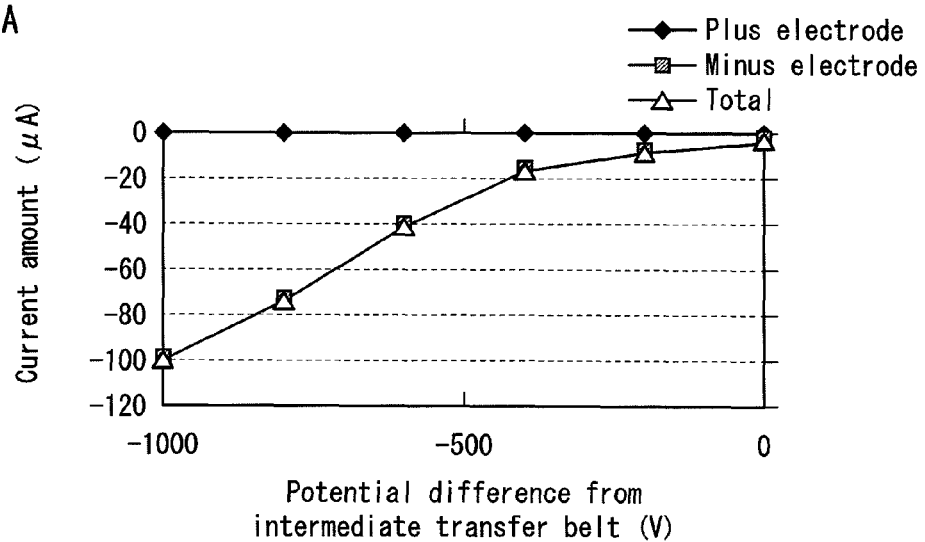
FIG. 5A is a graph illustrating the amount of discharge current flowing from the discharge electrodes 200 and 202 and the total amount of discharge current when a voltage of 0 V was applied to the plus discharge electrode 202 in each of the cases which differ from each other by 200 V in potential difference between the discharge electrode 200, 202 and the intermediate transfer belt 113.
Figure 5B:
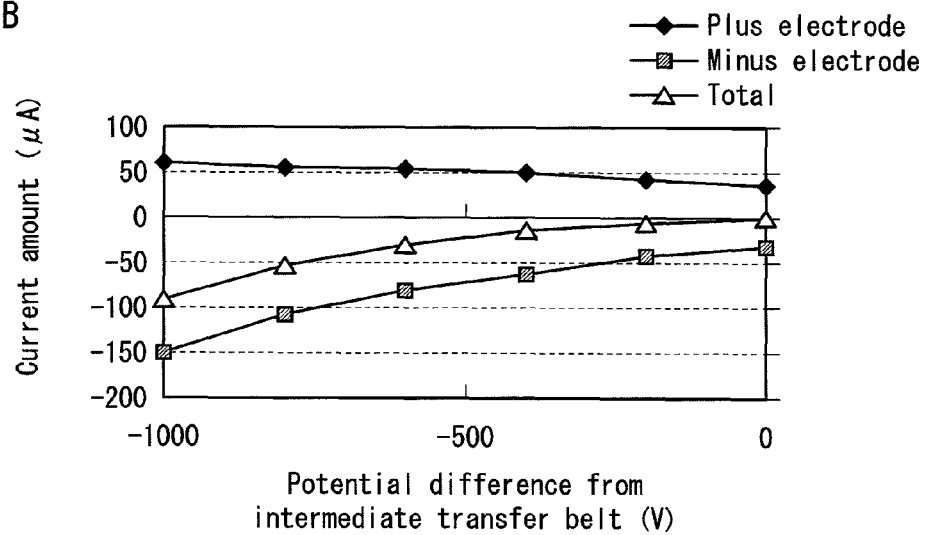
FIG. 5B is a graph illustrating the amount of discharge current flowing from the discharge electrodes 200 and 202 and the total amount of discharge current when a voltage of 3000 V was applied to the plus discharge electrode 202 in each of the cases which differ from each other by 200 V in potential difference between the discharge electrode 200, 202 and the intermediate transfer belt 113.
Figure 5C:
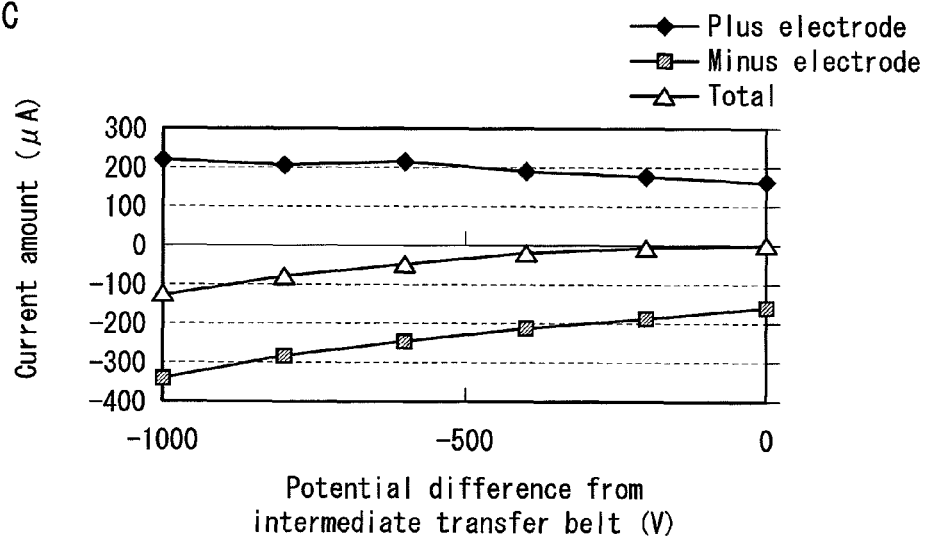
FIG. 5C is a graph illustrating the amount of discharge current flowing from the discharge electrodes 200 and 202 and the total amount of discharge current when a voltage of 4000 V was applied to the plus discharge electrode 202 in each of the cases which differ from each other by 200 V in potential difference between the discharge electrode 200, 202 and the intermediate transfer belt 113.

FIGS. 5A-5C are graphs illustrating the amount of discharge current flowing from the discharge electrodes 200 and 202 and the total amount of discharge current when voltages of 0 V, 3000 V and 4000 V were applied to the plus discharge electrode 202, respectively, in each of the cases which differ from each other by 200 V in potential difference between the discharge electrode 200, 202 and the intermediate transfer belt 113. Note that in the graphs, the vertical axis represents the amount of current, and the horizontal axis represents the potential difference between the discharge electrode 200, 202 and the intermediate transfer belt 113.

As illustrated in FIG. 5A, when a voltage of 0 V was applied to the plus discharge electrode 202, the whole discharge current of the minus discharge electrode 200 flows into the intermediate transfer belt 113, and the total amount of discharge current matches the discharge current amount of the minus discharge electrode 200. Even when the same amount of current flows into the intermediate transfer belt 113, it is possible to increase the amount of discharge current flowing from the minus discharge electrode 200 by increasing the voltage applied to the plus discharge electrode 202 (FIGS. 5B and 5C).

When the shape of the saw teeth of the minus discharge electrode 200 becomes non-uniform due to a time degradation, a non-uniform discharge occurs. However, by sufficiently increasing the amount of discharge current flowing from the minus discharge electrode 200, it is possible to reduce the adverse effect of the non-uniform discharge against the whole amount of discharge current. Also, in this case, the amount of current flowing into the intermediate transfer belt 113 can be adjusted by guiding as much as increase in the amount of discharge current flowing from the minus discharge electrode 200 to flow into the plus discharge electrode. This makes it possible to control the charging of the recording sheet. It is therefore possible to reduce the non-uniform neutralization of the recording sheet.

(3) Creeping Distance Limit

The following describes the relationship between the creeping distance between the minus discharge electrode 200 and the plus discharge electrode 202 and the potential difference at which a spark discharge occurs between the two electrodes. Needless to say, a spark discharge occurs when the potential difference between the two electrodes exceeds a threshold.

FIG. 6 is a table illustrating the relationship among the distance from the discharge electrodes to the tip of the discharge prevention plate, the creeping distance between the two discharge electrodes, and the lowest potential difference at which a spark discharge occurs. As illustrated in FIG. 6, the lowest potential difference at which a spark discharge occurs is approximately equal to a value obtained by multiplying 1 kV by the creeping distance [mm] between the two electrodes (the shortest distance along the discharge prevention plate).

When there is no discharge prevention plate, the potential difference at which a spark discharge occurs is determined in accordance with the straight-line distance between the two electrodes, instead of the creeping distance, and thus the two electrodes need to be separated from each other. That is to say, the use of the discharge prevention plate enables the discharge device 120 to be miniaturized.

(4) Positions of Discharge Electrodes 200 and 202 and Discharge Current Amount

Next, the relationship between the positions of the discharge electrodes 200 and 202 and the amount of discharge current flowing in the intermediate transfer belt 113 was evaluated.

FIGS. 7A and 7B are graphs illustrating the relationship between the positions of the discharge electrodes 200 and 202 and the amount of discharge current. FIG. 7A illustrates the total amount of discharge current flowing from the discharge electrodes 200 and 202 into the intermediate transfer belt 113. FIG. 7B illustrates the amount of discharge current flowing from the minus discharge electrode 200 into the intermediate transfer belt 113. Note that the distance between the minus discharge electrode 200 and the intermediate transfer belt 113 was set to 4 mm. As illustrated in FIG. 7A, regardless of the distance between the discharge electrodes 200 and 202, the total amount of discharge current is constant. On the other hand, as illustrated in FIG. 7B, the amount of discharge current flowing from the minus discharge electrode 200 into the intermediate transfer belt 113 increases as the distance between the discharge electrodes 200 and 202 increases. That is to say, by separating the minus discharge electrode 200 from the plus discharge electrode 202, it is possible to cause the discharge current to flow into the intermediate transfer belt 113 efficiently.

Note that, when the plus discharge electrode 202 is closer to the intermediate transfer belt 113 than the minus discharge electrode 200, most of the discharge current flowing from the minus discharge electrode 200 flows into the plus discharge electrode 202, and the intermediate transfer belt 113 cannot receive a sufficient amount of discharge current. Also, the distance between the discharge electrodes 200 and 202 has an effect on the strength of the discharge electric field. It is thus necessary to keep a distance that allows for generation of an optimal discharge electric field. In view of this, it is desirable to supply a sufficient amount of discharge current to the intermediate transfer belt 113 while keeping an optimal distance between the discharge electrodes 200 and 202, by disposing the minus discharge electrode 200 at a location close to the intermediate transfer belt 113 and disposing the plus discharge electrode 202 at a location distant from the intermediate transfer belt 113.

(5) Evaluation of Conventional Technology

Next, the conventional technology was evaluated to confirm the effect of the present invention.

FIGS. 8A-8C are graphs illustrating the non-uniform neutralization observed in each of the cases which use the conventional technology that uses only one discharge electrode and differ from each other in the applied voltage. FIG. 8A illustrates the case where only a DC voltage of −2400 V was applied to the discharge electrode. FIG. 8B illustrates the case where, in addition to the DC voltage of −2400 V, an AC voltage with frequency of 1 kHz and amplitude of 6 kV was applied. FIG. 8C illustrates the case where, in addition to the DC voltage of −2400 V, an AC voltage with frequency of 1 kHz and amplitude of 10 kV was applied. Note that, needless to say, the waveform of the AC voltages is the sine waveform.

As illustrated in FIG. 8A, a significant level of non-uniform neutralization is observed in the case where only the DC voltage was applied. Also, as illustrated in FIG. 8B, in the case where an AC voltage with amplitude of 6 kV was applied, a non-uniform neutralization was observed. This indicates that, in this case, the recording sheet was not separated from the intermediate transfer belt 113 with certainty. Furthermore, as illustrated in FIG. 8C, when an AC voltage with amplitude of 10 kV was applied, non-uniform neutralization was restricted and the recording sheet was prevented from being stuck to the intermediate transfer belt 113, but a significant amount of AC noise occurred. Accordingly, the device of this case cannot be put to practical use.

As apparent from the above discussion, the neutralization device of the conventional technology cannot solve the problem to the extent that the device can be put to practical use.

[4] Modifications

Up to now, the present invention has been described specifically through the embodiment. However, the present invention is not limited to the above-described embodiment, but may be modified variously as in the following.

(1) The above embodiment describes a case where the recording sheet on which a toner image has been second transferred is neutralized. However, not limited to this, the present invention may be modified as follows.

FIG. 9 is a cross-sectional view schematically illustrating the structure of an image creating unit 111 of the present modification. As illustrated in FIG. 9, the image creating unit 111 includes the photosensitive drum 121, charging device 122, exposing device 123, developing device 124, and cleaning device 125. As in the discharge device 120 of the above embodiment, the charging device 122 includes the discharge prevention plate 201 and discharge electrodes 200 and 202, where the discharge electrodes 200 and 202 having the saw teeth are stuck to the discharge prevention plate 201. The discharge electrodes 200 and 202 each receive a supply of DC voltage from the constant voltage source 230 and generate a corona discharge to uniformly charge the outer circumferential surface of the photosensitive drum 121.

Note that the distance between the minus discharge electrode 200 and the photosensitive drum 121 is 2 mm, the distance between the plus discharge electrode 202 and the photosensitive drum 121 is 10 mm, and the distance between the discharge prevention plate 201 and the photosensitive drum 121 is 2 mm.

The exposing device 123 exposes the outer circumferential surface of the photosensitive drum, and thereby forms an electrostatic latent image. The developing device 124 supplies toner to the outer circumferential surface of the photosensitive drum 121 so that the electrostatic latent image appears as an image. The first transfer roller 126, to which a transfer voltage has been applied, first transfers the toner image on the outer circumferential surface of the photosensitive drum 121 onto the intermediate transfer belt 113 that is moving rotationally in the direction indicated by the arrow A.

In the charging device 122 having the above structure, an experiment was conducted to charge an uncharged film in each of the cases where different DC voltages were applied to the minus discharge electrode 200 while applying a DC voltage of 4 kV to the plus discharge electrode 202. FIG. 10 illustrates graphs indicating the results of the experiment. The graphs 1001-1006 indicate non-uniform neutralizations observed when voltages of −1200 V, −1400 V, −1600 V, −1800 V, −2000 V and −2200 V were applied to the minus discharge electrode 200, respectively.

As illustrated in FIG. 10, it is possible to control the charge potential of the charging object (film) by varying the DC voltage applied to the minus discharge electrode 200 while fixing the DC voltage applied to the plus discharge electrode 202. Also, the conventional technology uses a charging device in which a discharge electrode having saw teeth is surrounded by a stabilizer, and a grid electrode is disposed to face a photosensitive drum. Compared to this structure, as described in the above embodiment, the discharge device 120 (the charging device 122 in the present modification) has a thin shape, and thus contributes to the miniaturization of the image creating unit 111.

Note that, as described in the above embodiment, of course the non-uniform neutralization can be restricted by increasing the potential difference between the minus discharge electrode 200 and the plus discharge electrode 202.

(2) In the above embodiment, the discharge electrodes 200 and 202 having saw teeth, for example, are used. However, not limited to this, according to the present invention, the discharge electrodes 200 and 202 may have other shapes than the saw teeth.

Furthermore, the discharge electrodes 200 and 202 may have different shapes. For example, the minus discharge electrode 200 may have saw teeth, and the plus discharge electrode 202 may be plate-like without having saw teeth. The effect of the present invention can be obtained regardless of the shapes of the discharge electrodes 200 and 202.

(3) The values of the sizes and voltages provided in the above embodiment are merely examples. That is to say, it is desirable to determine appropriate values of the sizes and voltages depending on the purposes, not limited to the values provided in the above embodiment. The effect of the present invention can be obtained regardless of the values.

(4) In the above embodiment, a color MFP is used as one example. However, of course the present invention is not limited to this. The same effect as the above-described one can be obtained when the discharge device of the present invention is loaded in a single-function machine such as a printer, a copier or a facsimile machine instead of an MFP.

[5] Summary

Lastly, the following summarizes the effects of the embodiment and modification of the present invention.

According to one aspect of the present invention, there is provided a discharge device for generating a corona discharge aimed at an object facing the discharge device, the discharge device comprising: a plate-like main discharge electrode configured to receive an applied direct current voltage and generate the corona discharge aimed at the object; a plate-like auxiliary discharge electrode disposed in parallel with the main discharge electrode and configured to receive an applied direct current voltage which is opposite in polarity to the applied direct current voltage received by the main discharge electrode, thereby causing the corona discharge to occur between the main discharge electrode and the auxiliary discharge electrode; and a plate-like insulating member disposed between the main discharge electrode and the auxiliary discharge electrode, wherein the insulating member is disposed in such a manner that a discharge current from the main discharge electrode flows to both the object and the auxiliary discharge electrode.

With the above structure, the discharge current from the main discharge electrode flows to the auxiliary discharge electrode. This makes it possible to increase the amount of discharge current flowing from the main discharge electrode, compared to the case where the discharge current from the main discharge electrode is caused to flow only to the discharging object. Thus it is possible to prevent the discharge from becoming non-uniform due to a time degradation. Also, since the main discharge electrode, the auxiliary discharge electrode and the insulating member are each plate-like and respective main surfaces thereof face each other, the structure contributes to the miniaturization of the discharge device. Furthermore, with this structure, a high-voltage power supply, which is required in a conventional technology, is not required. This brings a cost reduction.

In the above-described discharge device, the main discharge electrode may be disposed at a location closer to the object than to the auxiliary discharge electrode.

In the above-described discharge device, the main discharge electrode and the auxiliary discharge electrode may be both stuck to the insulating member.

The above structure particularly contributes to the miniaturization of the discharge device.

In the above-described discharge device, an end of the main discharge electrode on the object side may be disposed at a location closer to the object than an end of the insulating member on the object side.

In the above-described discharge device, a discharge path from the main discharge electrode to the object may be shorter than a discharge path from the main discharge electrode to the auxiliary discharge electrode.

The above structure makes it possible to increase the amount of discharge current flowing to the discharging object when the amount of discharge current from the main discharge electrode is the same.

In the above-described discharge device, an edge of the main discharge electrode on the object side may have a shape of saw teeth.

With the above structure, it is further possible to prevent a non-uniform discharge from occurring. It is further desirable that the following structure is realized in addition to the above structure.

In the above-described discharge device, an edge of the auxiliary discharge electrode on the object side has a shape of saw teeth.

In the above-described discharge device, V/D representing a ratio of V to D may be smaller than 1, wherein V denotes a potential difference in kV between the main discharge electrode and the auxiliary discharge electrode while both being in a state of receiving the applied direct current voltage, and D denotes a shortest length in mm of a discharge path between the main discharge electrode and the auxiliary discharge electrode.

With the above structure, it is possible to prevent a spark discharge from occurring between the main discharge electrode and the auxiliary discharge electrode. This makes it possible to generate a corona discharge stably.

According to another aspect of the present invention, there is provided the above discharge device for use in an image forming apparatus of an intermediate transfer method, wherein the object is a recording sheet on which a toner image has been second transferred from an intermediate transfer belt, and the recording sheet is neutralized by the corona discharge caused by the main discharge electrode before the recording sheet separates from the intermediate transfer belt.

With the above structure, it is possible to prevent occurrence of a non-uniform neutralization of the recording sheet on which a toner image has been second transferred. This makes it possible to prevent occurrence of a defective separation of the recording sheet or a paper jam which might occur when the recording sheet is stuck to the intermediate transfer belt.

According to a still another aspect of the present invention, there is provided the above discharge device for use in an image forming apparatus of an electrophotographic method, wherein the object is a photosensitive rotor, and the photosensitive rotor is charged by the corona discharge caused by the main discharge electrode before the photosensitive rotor is exposed to form an electrostatic latent image.

With the above structure, it is possible to miniaturize the charging device which is included in the image creating unit, and thus to miniaturize the image creating unit itself.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A discharge device for generating a corona discharge aimed at an object facing the discharge device, the discharge device comprising:
    a plate-like main discharge electrode configured to receive an applied direct current voltage and generate the corona discharge aimed at the object;
    a plate-like auxiliary discharge electrode disposed in parallel with the main discharge electrode and configured to receive an applied direct current voltage which is opposite in polarity to the applied direct current voltage received by the main discharge electrode, thereby causing the corona discharge to occur between the main discharge electrode and the auxiliary discharge electrode; and
    a plate-like insulating member disposed between the main discharge electrode and the auxiliary discharge electrode, wherein
    the insulating member is disposed in such a manner that a discharge current from the main discharge electrode flows to both the object and the auxiliary discharge electrode, and
    an end of an object-side of the insulating member closest to the object and an end of an object-side of the main discharge electrode are disposed at locations where distances from the object are the same.

2. The discharge device of claim 1, in combination with the object wherein
    the end of an object-side of the auxiliary discharge electrode is disposed at a location farther from the object than the end of the object-side of the main discharge electrode.

3. The discharge device of claim 1, wherein
the main discharge electrode and the auxiliary discharge electrode are both stuck to the insulating member.

4. The discharge device of claim 1, wherein
an edge of the main discharge electrode on the object side has a shape of saw teeth.

5. The discharge device of claim 1, wherein
an edge of the auxiliary discharge electrode on the object side has a shape of saw teeth.

6. The discharge device of claim 1, wherein
V/D representing a ratio of V to D is smaller than 1, wherein V denotes a potential difference in kV between the main discharge electrode and the auxiliary discharge electrode while both being in a state of receiving the applied direct current voltage, and D denotes a shortest length in mm of a discharge path between the main discharge electrode and the auxiliary discharge electrode.

7. The discharge device of claim 1 in combination with an image forming apparatus of an intermediate transfer method, wherein
    the object is a recording sheet on which a toner image has been second transferred from an intermediate transfer belt, and
    the recording sheet is neutralized by the corona discharge caused by the main discharge electrode before the recording sheet separates from the intermediate transfer belt.

8. The discharge device of claim 1 in combination with an image forming apparatus of an electrophotographic method, wherein
    the object is a photosensitive rotor, and
    the photosensitive rotor is charged by the corona discharge caused by the main discharge electrode before the photosensitive rotor is exposed to form an electrostatic latent image.

9. The discharge device of claim 1, further comprising a constant voltage source applying the direct current voltage to the main discharge electrode and the auxiliary discharge electrode.

10. A discharge device for generating a corona discharge aimed at an object facing the discharge device, the discharge device comprising:

a plate-like main discharge electrode configured to receive an applied direct current voltage and generate the corona discharge aimed at the object;

a plate-like auxiliary discharge electrode disposed in parallel with the main discharge electrode and configured to receive an applied direct current voltage which is opposite in polarity to the applied direct current voltage received by the main discharge electrode;

a constant voltage source providing the applied direct current voltage to the main discharge electrode and the auxiliary discharge electrode thereby causing the corona discharge to occur between the main discharge electrode and the auxiliary discharge electrode; and a plate-like insulating member disposed between the main discharge electrode and the auxiliary discharge electrode, wherein the insulating member is disposed in such a manner that a discharge current from the main discharge electrode flows to both the object and the auxiliary discharge electrode.

11. The discharge device of claim 10, in combination with the object, wherein the main discharge electrode is disposed at a location closer to the object than to the auxiliary discharge electrode.

12. The discharge device of claim 10, wherein the main discharge electrode and the auxiliary discharge electrode are both stuck to the insulating member.

13. The discharge device of claim 10, wherein the discharge device has an object side, an end of the main discharge electrode is disposed at the object side, and an end of the insulating member facing the object side is disposed at a distance from the object side.

14. The discharge device of claim 10, in combination with the object, wherein a discharge path from the main discharge electrode to the object is shorter than a discharge path from the main discharge electrode to the auxiliary discharge electrode.

15. The discharge device of claim 10, wherein an edge of the main discharge electrode on the object side has a shape of saw teeth.

16. The discharge device of claim 10, wherein an edge of the auxiliary discharge electrode on the object side has a shape of saw teeth.

17. The discharge device of claim 10, wherein V/D representing a ratio of V to D is smaller than 1, wherein V denotes a potential difference in kV between the main discharge electrode and the auxiliary discharge electrode while both being in a state of receiving the applied direct current voltage, and D denotes a shortest length in mm of a discharge path between the main discharge electrode and the auxiliary discharge electrode.

18. The discharge device of claim 10 in combination with an image forming apparatus of an intermediate transfer method, wherein the object is a recording sheet on which a toner image has been second transferred from an intermediate transfer belt, and the recording sheet is neutralized by the corona discharge caused by the main discharge electrode before the recording sheet separates from the intermediate transfer belt.

19. The discharge device of claim 10 in combination with an image forming apparatus of an electrophotographic method, wherein the object is a photosensitive rotor, and the photosensitive rotor is charged by the corona discharge caused by the main discharge electrode before the photosensitive rotor is exposed to form an electrostatic latent image.

* * * * *